US010177795B1

(12) United States Patent
Frishman et al.

(10) Patent No.: US 10,177,795 B1
(45) Date of Patent: Jan. 8, 2019

(54) CACHE INDEX MAPPING

(71) Applicant: Amazon Technologies, Inc., Reno, NV (US)

(72) Inventors: Ofer Frishman, Hod-Hasharon (IL); Erez Izenberg, Tel-Aviv (IL); Guy Nakibly, Kedumim (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/394,635

(22) Filed: Dec. 29, 2016

(51) Int. Cl.
| | |
|---|---|
| *H03M 13/00* | (2006.01) |
| *H04L 29/06* | (2006.01) |
| *G06F 12/12* | (2016.01) |
| *G06F 12/0813* | (2016.01) |
| *G06F 11/10* | (2006.01) |
| *H03M 13/09* | (2006.01) |

(52) U.S. Cl.
CPC ......... *H03M 13/63* (2013.01); *G06F 11/1004* (2013.01); *G06F 12/0813* (2013.01); *G06F 12/12* (2013.01); *H03M 13/09* (2013.01); *H04L 69/22* (2013.01); *G06F 2212/154* (2013.01); *G06F 2212/60* (2013.01); *G06F 2212/62* (2013.01); *G06F 2212/69* (2013.01)

(58) Field of Classification Search
CPC .................................................. G06F 11/104
USPC ....................... 714/807, 803, 800
See application file for complete search history.

(56) References Cited

U.S. PATENT DOCUMENTS

| | | | | |
|---|---|---|---|---|
| 8,165,146 B1* | 4/2012 | Melick | ................. | H04B 1/7163 |
| | | | | 370/390 |
| 9,680,846 B2* | 6/2017 | Haugsnes | ........... | H04L 63/1416 |
| 9,756,082 B1* | 9/2017 | Haugsnes | ............. | H04L 63/205 |
| 2008/0114937 A1* | 5/2008 | Reid | ..................... | G06F 11/362 |
| | | | | 711/117 |
| 2012/0011351 A1* | 1/2012 | Mundra | ................. | G06F 21/72 |
| | | | | 713/1 |
| 2017/0079079 A1* | 3/2017 | Pathuri | ............... | H04W 76/021 |

* cited by examiner

*Primary Examiner* — Fritz Alphonse
(74) *Attorney, Agent, or Firm* — Hogan Lovells US LLP

(57) ABSTRACT

Systems and methods in accordance with various embodiments of the present disclosure provide approaches for mapping entries to a cache using a function, such as cyclic redundancy check (CRC). The function can calculate a colored cache index based on a main memory address. The function may cause consecutive address cache indexes to be spread throughout the cache according to the indexes calculated by the function. In some embodiments, each data context may be associated with a different function, enabling different types of packets to be processed while sharing the same cache, reducing evictions of other data contexts and improving performance. Various embodiments can identify a type of packet as the packet is received, and lookup a mapping function based on the type of packet. The function can then be used to lookup the corresponding data context for the packet from the cache, for processing the packet.

20 Claims, 7 Drawing Sheets

CACHE INDEX MAPPING

BACKGROUND

In computer networks, more data and types of data are being exchanged between systems. This can mean that different types of packets are being processed over a given time period. Each type of packet may be associated with a different data context used during processing of the packets. A cache may be used to store the data contexts, improving processing performance of the packets by reducing calls to the main system memory. However, often during a particular time period, the same portion of a data context may be used by a series of ingress packets which may cause data to be allocated in the same physical locations in the cache (e.g., the same indexes and way numbers). Depending on the number of data contexts in use during this time period, this may lead to eviction of other data contexts, increasing the number of calls to the system performance and reducing overall performance.

BRIEF DESCRIPTION OF THE DRAWINGS

Various embodiments in accordance with the present disclosure will be described with reference to the drawings, in which.

DETAILED DESCRIPTION

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Systems and methods in accordance with various embodiments of the present disclosure may overcome one or more of the foregoing or other deficiencies experienced in conventional approaches for cache mapping while processing packets. In particular, various embodiments provide approaches for mapping entries to a cache using a function, such as cyclic redundancy check (CRC). The function can calculate a colored cache index based on an address cache index which was determined based on a main memory address. The function may cause consecutive address cache indexes to be spread throughout the cache according to the indexes calculated by the function. In some embodiments, each data context may be associated with a different function, enabling different types of packets to be processed while sharing the same cache, reducing evictions of other data contexts and improving performance. Various embodiments can identify a type of packet as the packet is received, and lookup a mapping function based on the type of packet. The function can then be used to lookup the corresponding data context for the packet from the cache, for processing the packet.

Figure 1:
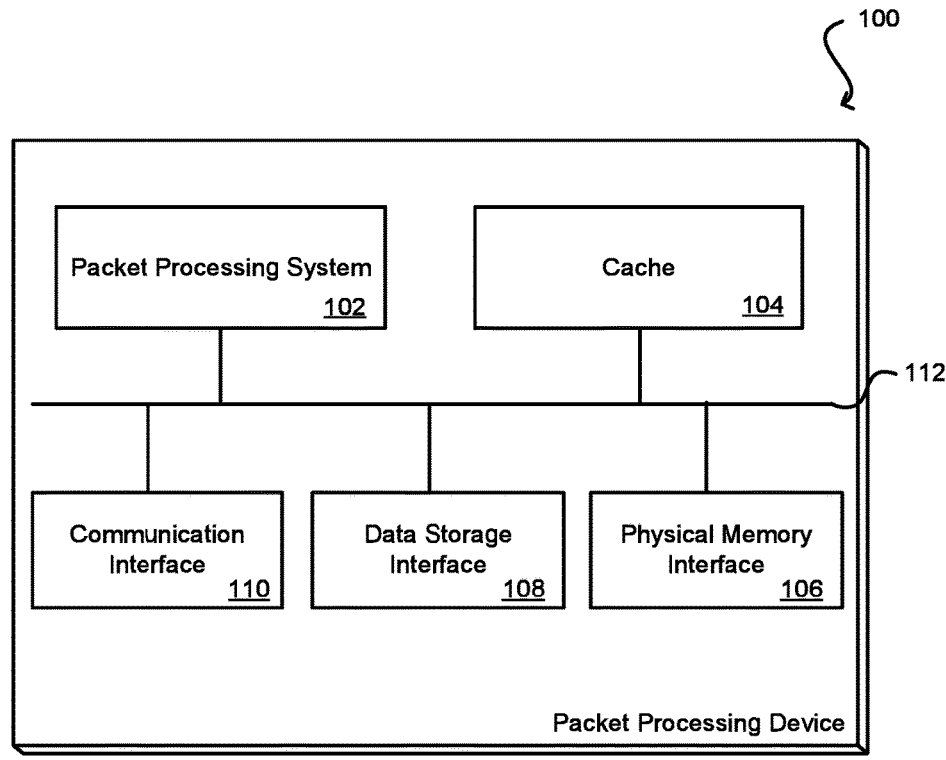
FIG. 1 illustrates an example of a packet processing device, in accordance with various embodiments.

FIG. 1 illustrates an example of a packet processing device 100, in accordance with various embodiments. In accordance with the illustrated embodiment, the packet processing device 100 includes a packet processing system 102, a cache 104, and one or more interfaces including a physical memory interface 106, data storage interface 108, and communication interface 110. The components may be integrated into a single network processor, such as an application-specific integrated circuit (ASIC) or other processor, or as a plurality of distinct components connected by a communication bus 112 or other communication lines. In some embodiments, packet processing device 100 may be incorporated into a network switch, router, or other network device connecting computing systems or data centers.

In various embodiments, packets may be received by packet processing device 100 through communication interface 110. Communication interface 110 may include a network interface such as an Ethernet or InfiniB and port. The packets may include various types of packets, such as network packets, storage packets, user packets, etc. Each packet may be formatted differently based on the protocol in use, such as IPv4 plus TCP, UDP, remote direct memory access (RDMA), or other protocol. Packet processing system 102 can process the packets. Packet processing system 102 can include one or more processors, including single or multi-core processors. The processors may include general purpose processors or specialized processors, such as network processors. In various embodiments, packet processing system 102 may include separate subsystems for processing ingress packets and egress packets. In some embodiments, cache 104 may be part of packet processing system 102 (e.g., on-chip cache) or may be accessible to packet processing system 102.

Cache 104 may be an N-way set associative cache. In various embodiments, cache 104 may be used in the processing of ingress packets, received through communication interface 110. As discussed, each ingress packet may be associated with (e.g., have affinity to) one or more data contexts. The data contexts can be requested from physical memory, through physical memory interface 106, or from disk, through data storage interface 108, and stored in the cache 104. By maintaining the data contexts in the cache, ingress packets can be processed more efficiently, by reducing latency introduced by fetching the data contexts from memory for each packet. In an N-way set associative cache, a location in main memory can be cached in one of N locations in the cache. Data may be transferred from the main memory to the cache in fixed size blocks called cache lines. As such, in an N-way set associative cache, each cache line can be allotted to N different locations. A pointer to the physical location in the cache can include an index and way number. The index is usually determined based on the address of the portion of the main memory being cached. In some embodiments, the way number may be set by the cache, a cache controller, or other hardware or software.

In various embodiments, a data context associated with a type of packet may include a scatter gather list (SGL), a queue ring, or other structure. As an example, a queue ring can be thought of as containing a number of slots wherein each slot is a data structure that corresponds to an I/O operation. Each I/O operation may be associated with data from multiple memory pages. Accordingly, each data structure in the ring buffer contains a set of pointers to the memory pages for the I/O operation, as well as any metadata associated with the I/O operation. This data structure may be stored in the main memory in contiguous address spaces. However, when stored in cache 104, these contiguous memory addresses corresponding to the data context would be stored in consecutive lines in the cache. This may lead to a large portion of the cache being blocked off for one data context, or potentially having portions of the data context evicted as other types of packets are processed and their data contexts are added to the cache.

Figure 2:
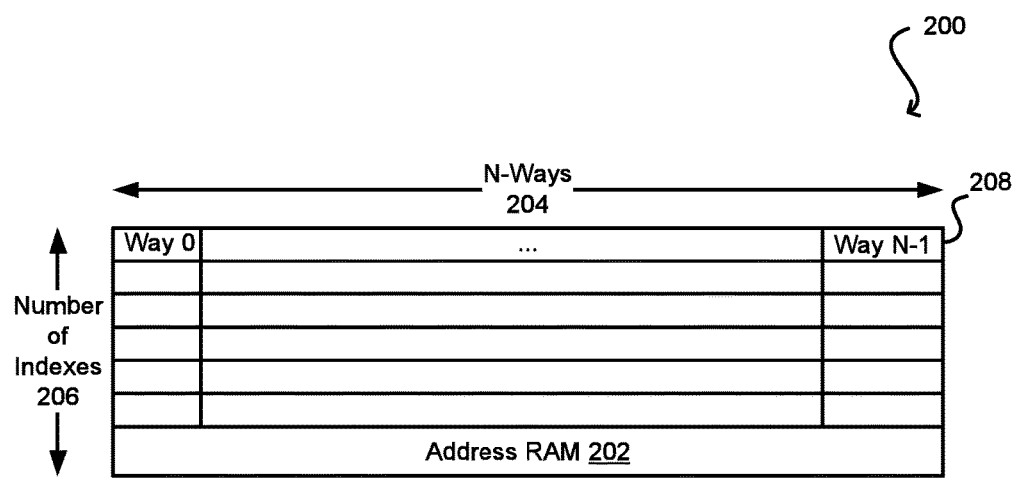
FIG. 2 illustrates an example of a cache structure, in accordance with various embodiments.

FIG. 2 illustrates an example of a cache structure 200, in accordance with various embodiments. It should be understood that reference numbers for like components may be carried over between figures for purposes of explanation, but this should not be interpreted as limiting the scope of the various embodiments. As discussed, a cache 200 may store data contexts for use in processing different types of packets received by a packet processing device. Cache 200 may be an N-way set associative cache. As shown, cache 200 may be organized into an address space in RAM 202 (such as SRAM), which includes a plurality of ways 204 and a plurality of indexes 206. In an N-way set associative cache, a location in main memory can be cached in one of N locations in the cache. Data may be transferred from the main memory to the cache in fixed size blocks called cache lines or ways. As such, in an N-way set associative cache, each cache line can be allotted to N different locations, from way 0 to way N−1 208. A pointer to the physical location in the cache can include an index and a line or way number. The index in the cache may be determined based on the address of the portion of the main memory being cached. In some embodiments, the way number may be set by the cache, a cache controller, or other hardware or software.

As discussed, cache entries may be mapped to an index according to the address in main memory of the data being cached. For a cache having X indexes, the main memory address can be mapped to an index using log 2(X) bits. Accordingly, a cache having 16 indexes can be mapped using 4 bits. Therefore, in some embodiments, the 4 least significant bits of a main memory address may be used to determine the index of the data when stored in a cache. Alternatively, the most significant bits of the main memory address may be used. A simple mapping to the cache may just use this address cache index mapping to store data from the main memory in the cache. However, as discussed, such standard index mapping may lead to inefficiencies as data for different types of packets evicts previously stored data that is still in use. Accordingly, embodiments may use an additional mapping function to further spread data throughout the cache in a uniform and predictable way.

In accordance with an embodiment, the mapping function can receive the address cache index and convert it to a colored index. The mapping function scatters the colored indexes throughout the cache such that the same colored index does not appear consecutively in the cache. Additionally, different types of packets, which are associated with different data contexts, may be mapped with different functions. For example, in a system that receives four different types of packets, four different mapping functions may be utilized to convert between the address cache index to the colored (e.g., mapped) index.

Figure 3:
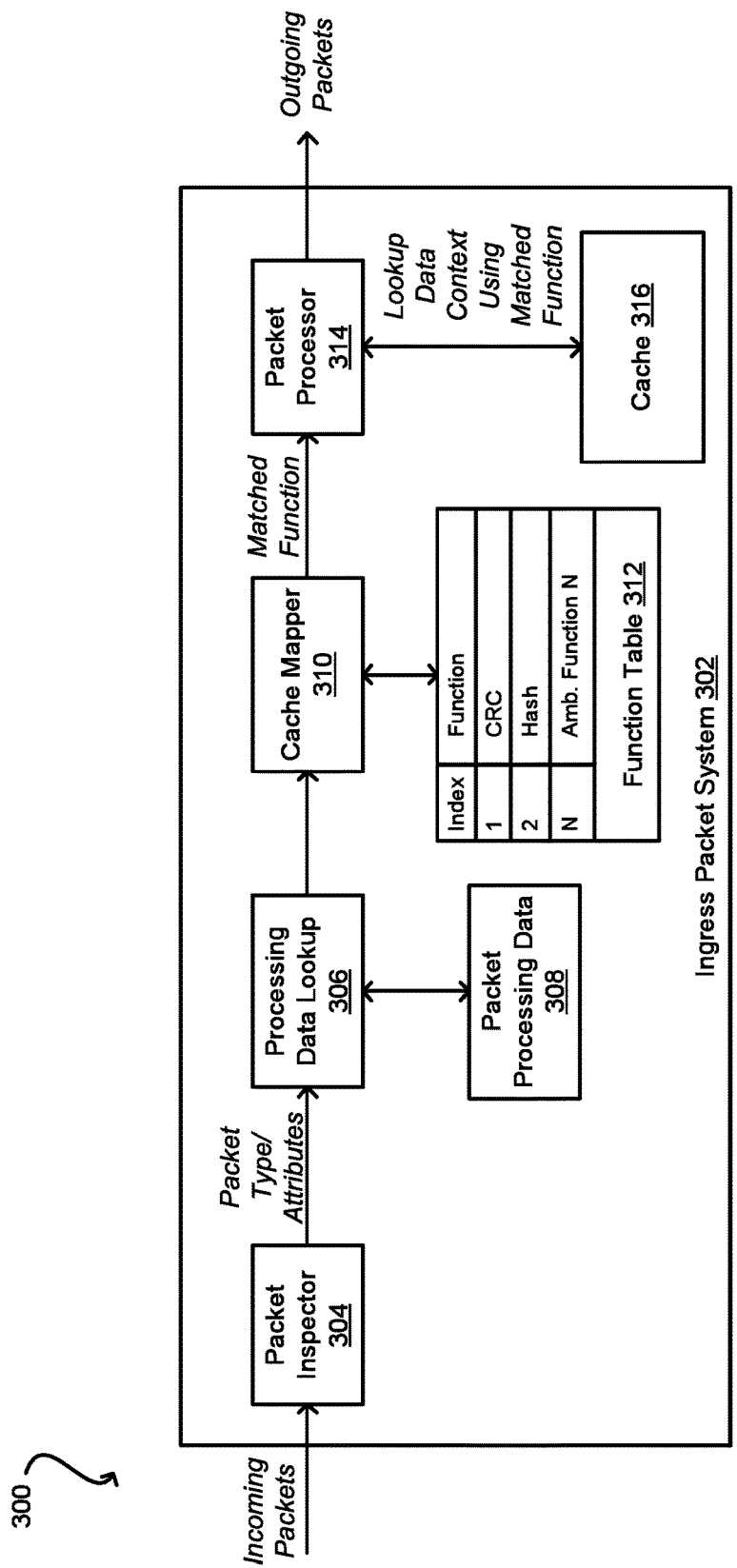
FIG. 3 illustrates an example system for packet processing using N-way cache mapping, in accordance with various embodiments.

FIG. 3 illustrates an example system 300 for packet processing using N-way cache mapping, in accordance with various embodiments. It should be understood that reference numbers for like components may be carried over between figures for purposes of explanation, but this should not be interpreted as limiting the scope of the various embodiments. As discussed, embodiments may use a mapping function to convert between a standard address cache index to a colored index. As shown in FIG. 3, an ingress packet system 302 may receive incoming packets. Ingress packet system 302 may represent packet processing system 102, a subsystem of packet processing system 102, or a separate processor or chip. Each incoming packet may be processed through a pipeline as shown.

A packet inspector 304 can receive an incoming packet and determine a packet type. For example, each packet may have an attribute that identifies what type of packet it is. The protocol of the packet may be indicated by a protocol attribute, where different protocols may be indicated by different values. Packet inspector 304 may identify the type of protocol using the protocol attribute. Additionally, packets may also have other attributes that may be extracted by packet inspector 304. For example, storage or RDMA packets may include a command attribute; a network packet might have a priority attribute, function number; etc. Packet inspector 304 may pass the packet type and other attribute data to processing data lookup module 306.

In various embodiments, different types of packets may be associated with different processing data 308 or commands which may be used to process those types of packets. This processing data may be stored in a database table, or other data structure, and may be looked-up using the packet type and other attributes identified by packet inspector 304. Processing data lookup module 306 can map the packet type and/or attributes to one or more indexes in packet processing data structure 308 and retrieve the processing data or commands associated with the received packet. In some embodiments, packet processing data 308 may indicate a data context to be used to process the packet type and may provide one or more pointers to the data context in main memory.

Additionally, as discussed, different packet types may be associated with different mapping functions that convert the standard address cache index, based on the main memory address of the data, into a colored index that is spread out through the cache. As discussed, using the standard address cache index method, the least significant or most significant bits of the location in memory can be used to map to an index in the cache. The way number may be determined based on other parameters associated with the data, set by the cache, or by other methods. Cache mapper 310 can use the packet type and/or other attributes to identify a mapping function to use to map the memory address to a cache index.

In some embodiments, the standard cache mapping may be adequate. For example, network packets may be mapped using the standard address cache index, based on the least significant bits of the data context associated with the network packet type. However, for storage packets, a different data context may be used. For example, a storage data context may include a scatter gather list, or a queue ring or buffer ring. Such a data context may be stored in a specific location in the main memory, in contiguous addresses.

Accordingly, the standard mapping would result in storing the data in consecutive addresses in the cache. Instead of using the address cache index as the mapping, in various embodiments, this address cache index can be used as the input to a mapping function. Cache mapper 310 can identify the mapping function for the incoming packet based on its type using function table 312. In some embodiments, function table 312 may be indexed using the packet type attribute value determined by packet inspector 304. Cache mapper 310 can retrieve the matched function from function table 312. As shown in FIG. 3, function table 312 may include various functions, including CRC, a hash function, or other functions. As discussed, each type of packet may be associated with a different function. Each function may be used with a static seed or initial value. In some embodiments, different packet types may be associated with different seed or initial values. By using a static seed or initial value, each function may become an ambiguous function which provides the same output value for a given input value. This enables the ambiguous function to be used to reliably look up the same mapped location for a given input location. A function configured with a static seed may be referred to herein as an ambiguous function. In some embodiments, different packet types may be associated with the same function, but may utilize a different seed value for that function.

Packet processor 314 can use the processing data 308, including the corresponding data context location, retrieved by processing data lookup 306 and matched function retrieved by cache mapper 310 to process the incoming packet. For example, the address cache index can be determined using the main memory address for the data context associated with the incoming packet. As discussed, this may be calculated by taking the log 2 of the least significant bits of the main memory address. The address cache index can then be used as the input for the matched function, such as the cyclic redundancy check (CRC) function. In some embodiments, the address cache index can be combined with a value representing the data context using an exclusive or (XOR) operation and the result may be used as input to the CRC function. In some embodiments, a seed value may be used with the CRC function, where different seed values are associated with different types of packets. The result of the CRC function may then be utilized as the colored index for looking up the data context in the cache 316. The CRC function spreads data that would otherwise be stored in consecutive addresses across the cache. In various embodiments, alternative functions may also be used. For example, different portions of the main memory address may be selected and/or combined, rather than just the least significant bits or more significant bits.

In various embodiments, the example shown in FIG. 3 may be implemented in a computing device including electronic circuitry. The computing device may be a processor, a system-on-chip (SoC), a field-programmable gate array (FPGA), an application-specific integrated circuit (ASIC), or other configurable computing device. For example, packet inspector 304 may be implemented as a packet inspector circuit that determines the packet type of an incoming packet. A processing data lookup circuit may identify packet processing data included in the electronic circuitry. A cache mapper circuit may then determine a cache access function, from a function table, based on the packet type. The function table may be implemented in the electronic circuitry. The packet processor may then lookup data context in a hardware cache 316 using the cache access function.

In various embodiments, any mapping function may be used which results in the same mapping for the same input each time it is used. For example, if the same address to a portion of a data context is received associated with consecutive packets, and the first packet results in a change to the corresponding cached data at a mapped location, the second packet needs to be mapped to the same mapped location to ensure it is using the current data from the data context. Using a function that results in the same output each time it is executed on a given input (also referred to as an ambiguous function) also enables the system to perform a lookup in the cache to determine whether there is a hit or miss, when a read request is received for a portion of a data context. In some embodiments, the function used for a given packet type may be determined based on performance.

In some embodiments, common packet types include storage packets, management packets, and network packets. Each of these packet types may be associated with a different function (or a different seed value for the same function) used to map the address cache index to the colored index. The seed value associated with a given packet type may be static for that packet type. In various embodiments, each packet type may be associated with a different static seed value. For example, network traffic may be directed into user queues. These queues may hold buffered descriptors and are generally stored in main memory in consecutive address spaces. As discussed, rather than storing these in the cache in consecutive indexes using the address cache indexes, a function such as the CRC function can be used to spread the data across non-consecutive indexes in the cache. In some embodiments, for storage traffic, e.g., to databases or other data stores, traffic may also be directed to queues. However, these queues may store information for how to process the packets. When moved into the cache, it may be useful to store this data in consecutive indexes, for example, in case the data needs to be locked. Accordingly, the address cache indexes may be used.

Accordingly, various embodiments enable different packet types to be processed using the same cache, while reducing misses due to one data context evicting all or portions of another data context. This enables more efficient processing of packets while consuming fewer resources (e.g., without providing and maintaining different cache instances for different types of packets, which may lead to duplication across instances and may require large mapping tables to be maintained).

Figure 4:
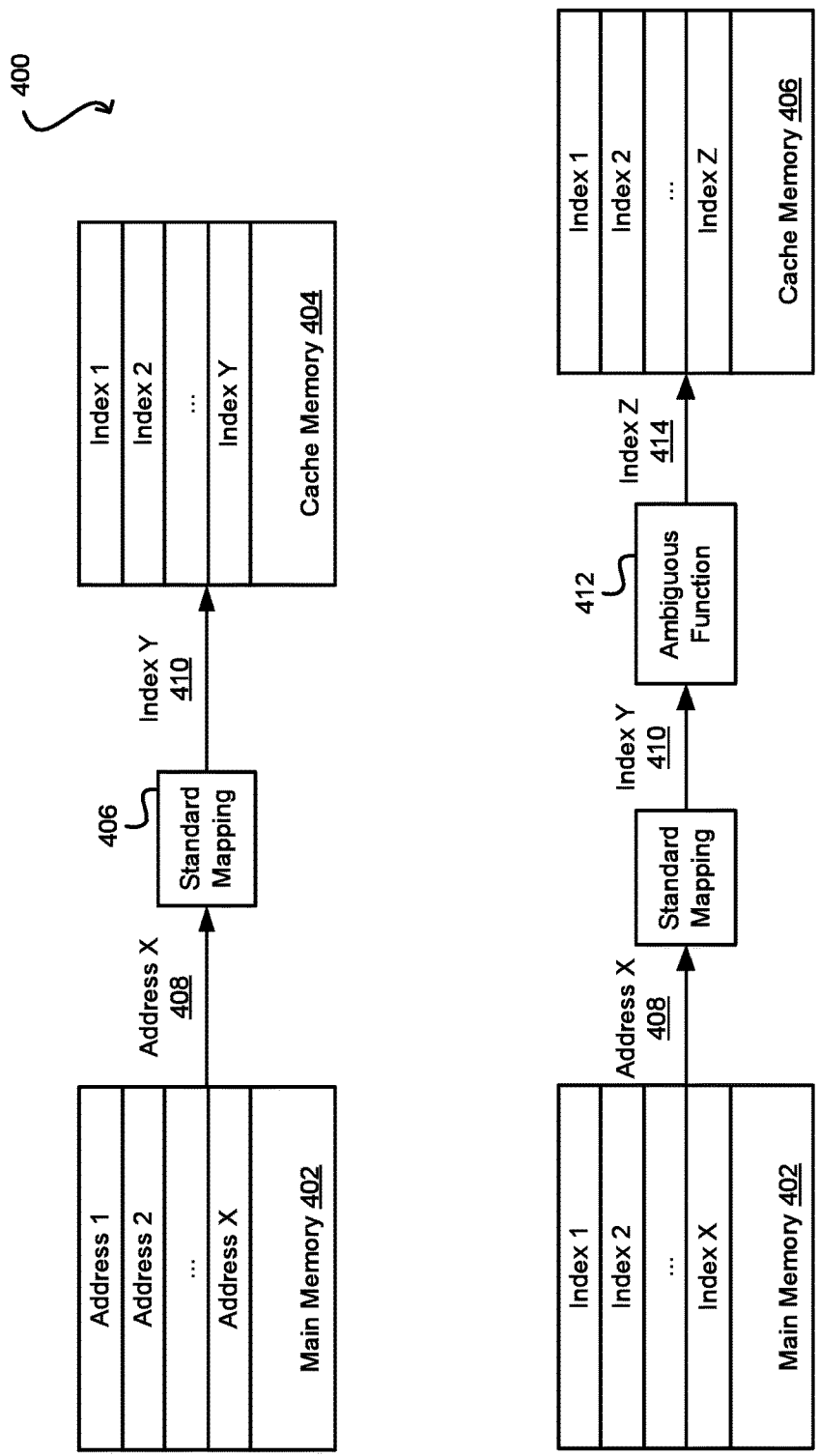
FIG. 4 illustrates examples of cache mapping, in accordance with various embodiments.

FIG. 4 illustrates examples 400 of cache mapping, in accordance with various embodiments. As shown in FIG. 4, data may be stored at various addresses in main memory 402. To improve performance, data from the main memory may be stored in cache memory 404. As discussed, data may be stored in the cache 404 based on where it is stored in main memory 402. For example, a standard mapping 406 may take the address 408 from main memory 402 and determine a corresponding index Y 410. The standard mapping may include determining the index based on the most significant bits or least significant bits of address X. For a cache having X indexes, the main memory address can be mapped to an index using log 2(X) bits of the address. Accordingly, a cache having 16 indexes can be mapped using 4 bits. Therefore, in some embodiments, the 4 least significant or most significant bits of a main memory address may be used to determine the index of the data when stored in a cache. In various embodiments, since the number of indexes in a cache may be known, the number of bits of the address in the main memory to use for the address cache index may be predetermined. Using such a standard mapping, contiguous addresses from main memory 402 may be stored in consecutive addresses in cache 404.

In various embodiments, an alternative index mapping may be implemented using one or more ambiguous functions 412. An address 408 in main memory 402 may be mapped 406 to an index 410. This index may then be used as an input to an ambiguous function 412. Ambiguous functions may include CRC, hash functions, or other functions that produce the same output value for a given input value. The ambiguous function may map index Y 410 to index Z 414 in cache 404. As discussed, the ambiguous function used may be specific to the type of packet being mapped. The ambiguous function can scatter the indexes 414 throughout the cache such that the same index does not appear consecutively in the cache. Additionally, different types of packets, which are associated with different data contexts, may be mapped with different functions. For example, in a system that receives four different types of packets, four different mapping functions may be utilized to convert between the address cache index 410 to the mapped index 414.

Figure 5:
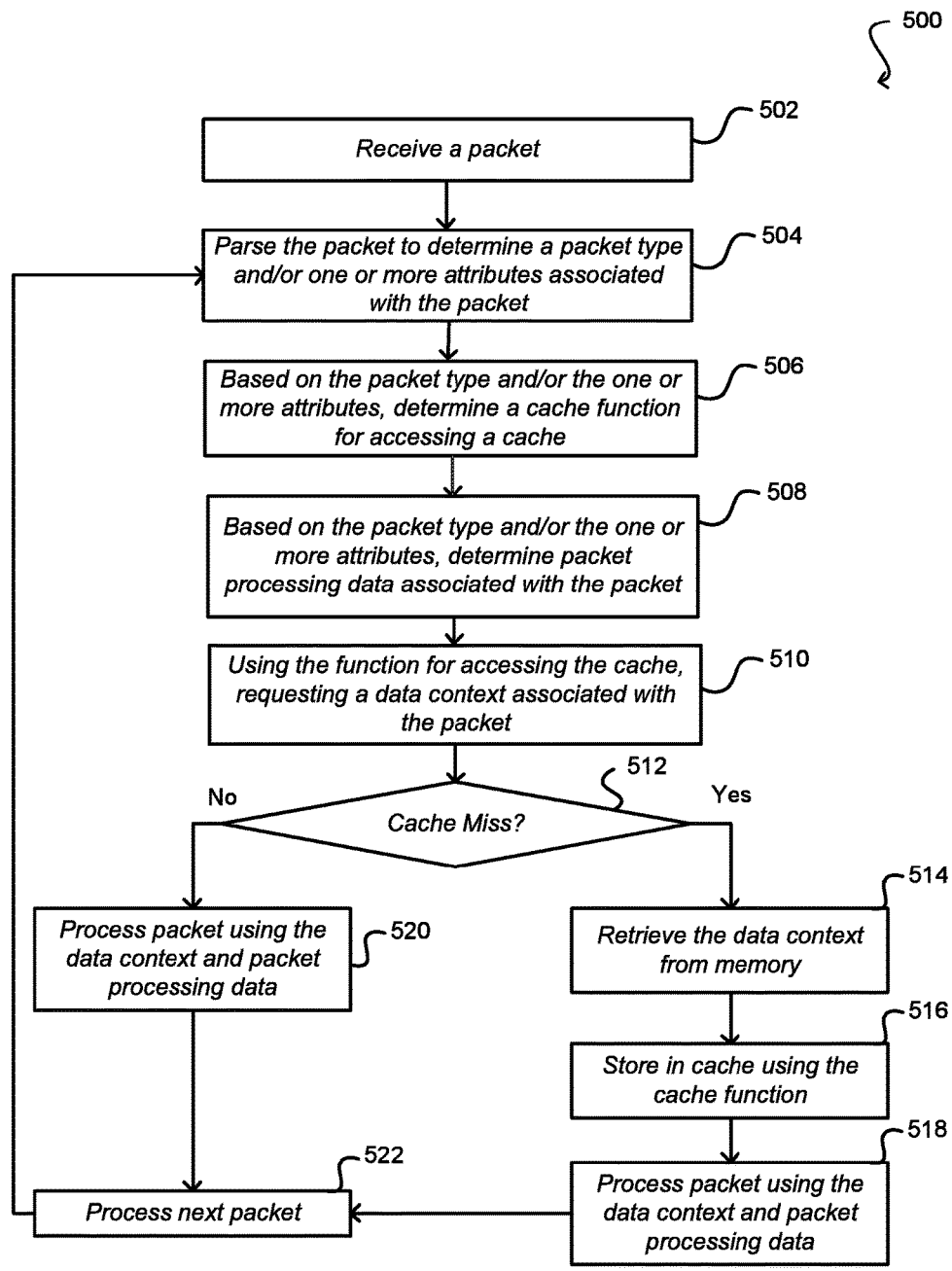
FIG. 5 illustrates an example process for packet processing using N-way cache mapping, in accordance with various embodiments.

FIG. 5 illustrates an example process 500 for packet processing using N-way cache mapping, in accordance with various embodiments. Although this figure may depict functional operations in a particular sequence, the processes are not necessarily limited to the particular order or operations illustrated. One skilled in the art will appreciate that the various operations portrayed in this or other figures can be changed, rearranged, performed in parallel or adapted in various ways. Furthermore, it is to be understood that certain operations or sequences of operations can be added to or omitted from the process, without departing from the scope of the various embodiments. In addition, the process illustrations contained herein are intended to demonstrate an idea of the process flow to one of ordinary skill in the art, rather than specifying the actual sequences of code execution, which may be implemented as different flows or sequences, optimized for performance, or otherwise modified in various ways.

As shown in FIG. 5, a packet may be received 502. The packet may be associated with a packet type and one or more attributes. The packet can be parsed 504 to determine the packet type and the one or more attributes. In some embodiments, the packet type can include a network packet, management packet, storage packet, or other packet type. Packet attributes may include a value indicating packet type, a destination address, a protocol attribute, where different protocols may be indicated by different values, command attributes, priority attributes, etc. Based on the packet type and the one or more attributes, a cache function for accessing a cache can be determined 506. The cache function can receive an index value as an input and generate a new index value. Each cache function reproducibly generates the same new index value for the same input index value. In some embodiments, packet processing data associated with the packet type can be determined 508. The packet processing data may include commands, forwarding instructions, or other data used to process the packets. A data context associated with the packet type can be requested 510 from the cache using the cache function. If there is a cache miss 512, the data context can be retrieved 514 from main memory. The data context may then be stored 516 in the cache using the cache function. The packets may then be processed 518 using the data context and packet processing data. If there is no cache miss, the packet can be processed 520 using the data context and packet processing data. Once the packet has been processed, processing 522 may proceed to the next packet, and processing may return to step 504.

Figure 6:
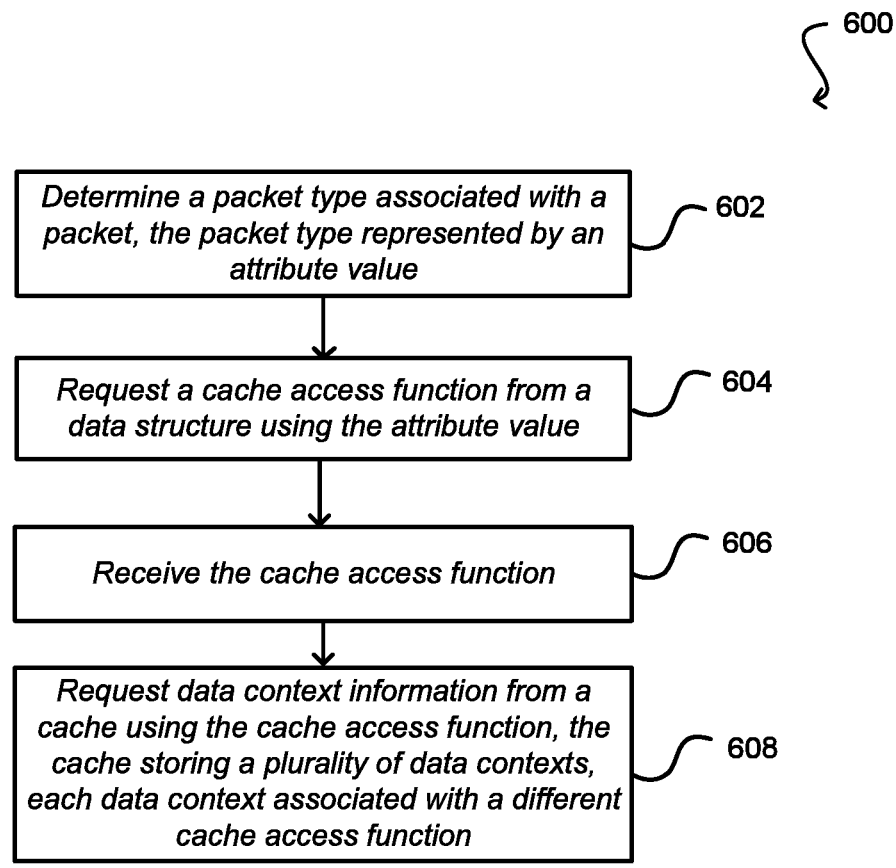
FIG. 6 illustrates an example process for determining cache mapping for a packet, in accordance with various embodiments.

FIG. 6 illustrates an example process 600 for determining cache mapping for a packet, in accordance with various embodiments. Although this figure may depict functional operations in a particular sequence, the processes are not necessarily limited to the particular order or operations illustrated. One skilled in the art will appreciate that the various operations portrayed in this or other figures can be changed, rearranged, performed in parallel or adapted in various ways. Furthermore, it is to be understood that certain operations or sequences of operations can be added to or omitted from the process, without departing from the scope of the various embodiments. In addition, the process illustrations contained herein are intended to demonstrate an idea of the process flow to one of ordinary skill in the art, rather than specifying the actual sequences of code execution, which may be implemented as different flows or sequences, optimized for performance, or otherwise modified in various ways.

As shown in FIG. 6, a packet type associated with a packet may be determined 602. The packet type may be represented by a packet attribute value. A cache access function can be requested 604 from a data structure using the attribute value. The data structure may be indexed using the packet attribute values. For example, an attribute value corresponding to a network packet may be mapped to a network packet cache access function in the data structure. The cache access function can be received 606 from the data structure. Data context information may then be requested 608 from a cache using the cache access function. As discussed, different cache access functions may be used for each type of packet, enabling multiple types of packets to be processed in a shared cache. A plurality of data contexts, each data context associated with a different cache access function and the different type of packet may be stored in the cache. By distributing the data contexts throughout the cache, evictions can be reduced between the different data contexts. As discussed, data contexts may be used to process packets as they are received. Each packet type may be associated with a different data context, such as a scatter gather list (SGL), a queue ring, or other structure. The data context may store data related to the current processing of the data packet and/or future processing of the data packet, such as a location identifier for a next packet processing stage. Data context information as used herein may refer to all or a portion of one or more data contexts.

Figure 7:
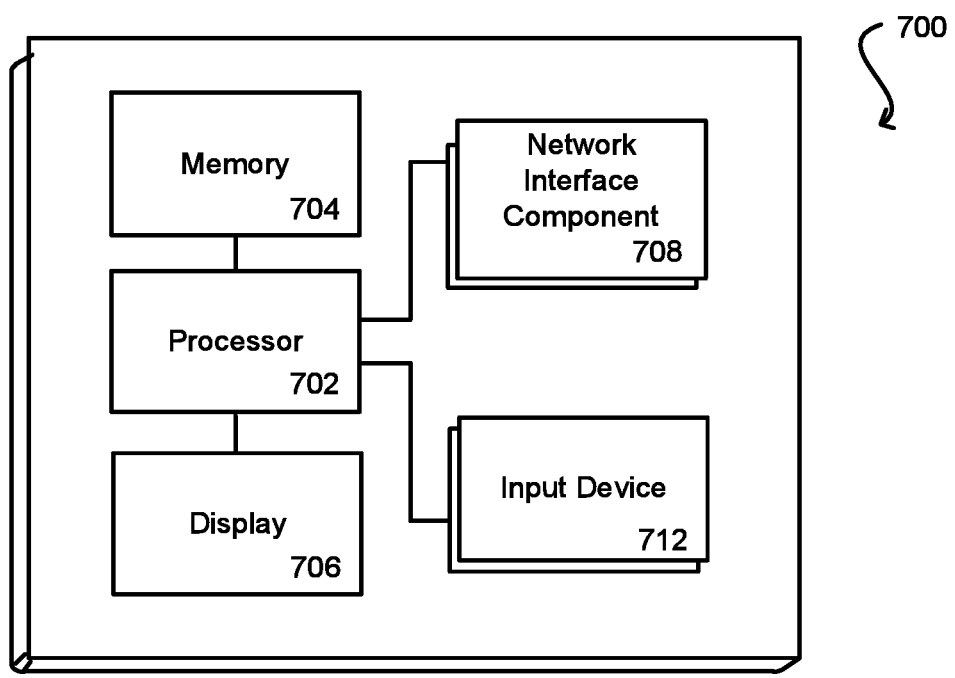
FIG. 7 illustrates a logical arrangement of a set of general components of an example computing device that can be utilized in accordance with various embodiments.

FIG. 7 illustrates a logical arrangement of a set of general components of an example computing device 700. In this example, the device includes a processor 702 for executing instructions that can be stored in a memory device or element 704. As would be apparent to one of ordinary skill in the art, the device can include many types of memory, data storage, or non-transitory computer-readable storage media, such as a first data storage for program instructions for execution by the processor 702, a separate storage for images or data, a removable memory for sharing information with other devices, etc. The device typically will include some type of display element 706, such as a touch screen or liquid crystal display (LCD), although devices such as portable media players might convey information via other means, such as through audio speakers. As discussed, the device in many embodiments will include at least one input element 708 able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device. In some embodiments, the computing device 700 of FIG. 7 can include one or more network interface elements 708 for communicating over various networks, such as a Wi-Fi, Bluetooth, RF, wired, or wireless communication systems. The device in many embodiments can communicate with a network, such as the Internet, and may be able to communicate with other such devices.

Figure 8:
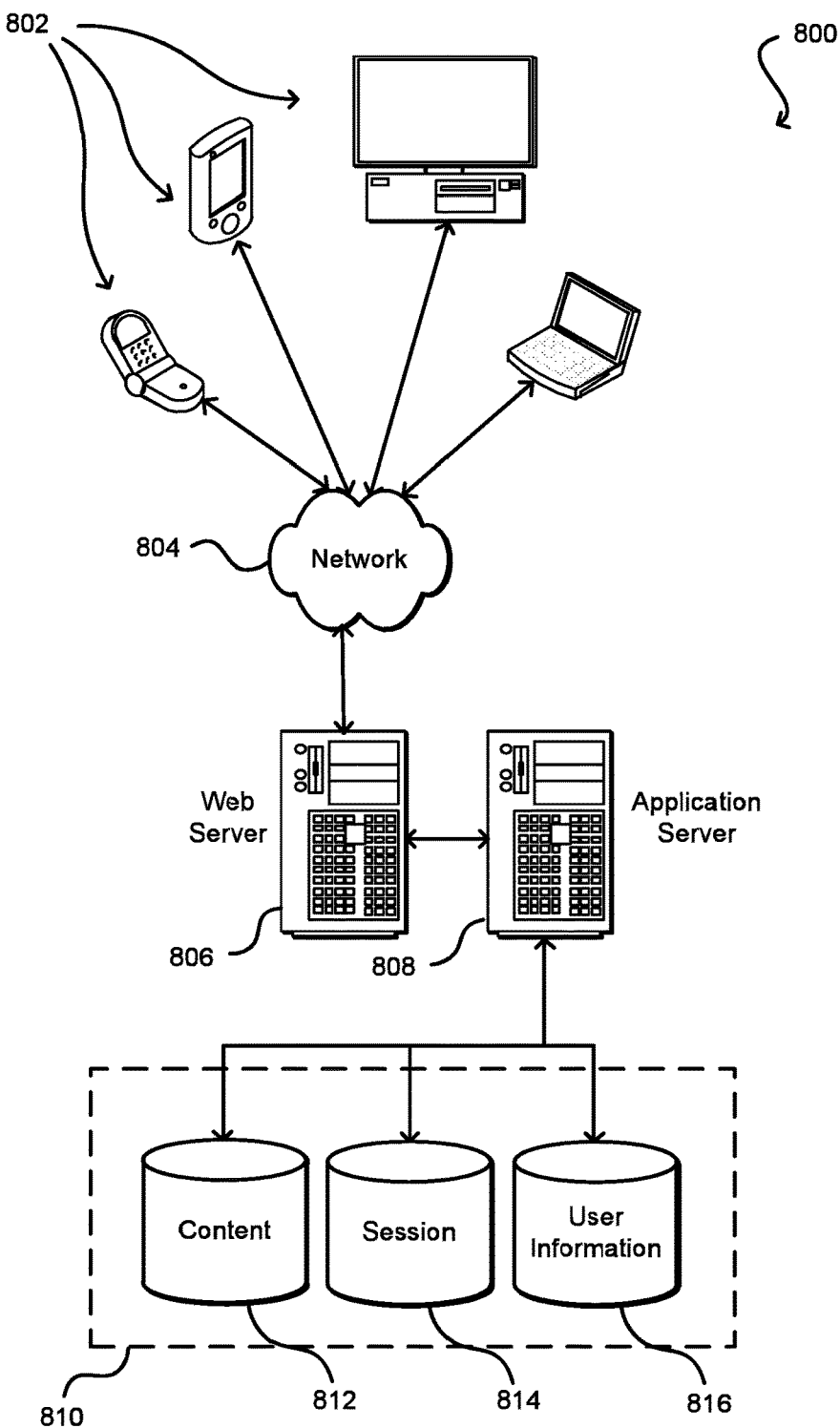
FIG. 8 illustrates an example of an environment for implementing aspects in accordance with various embodiments.

As discussed, different approaches can be implemented in various environments in accordance with the described embodiments. For example, FIG. 8 illustrates an example of an environment 800 for implementing aspects in accordance with various embodiments. As will be appreciated, although a Web-based environment is used for purposes of explanation, different environments may be used, as appropriate, to implement various embodiments. The system includes an electronic client device 802, which can include any appropriate device operable to send and receive requests, messages or information over an appropriate network 804 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server 806 for receiving requests and serving content in response thereto, although for other networks an alternative device serving a similar purpose could be used, as would be apparent to one of ordinary skill in the art.

The illustrative environment includes at least one application server 808 and a data store 810. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device 802 and the application server 808, can be handled by the Web server 806. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log or session data 814. It should be understood that there can be many other aspects that may need to be stored in the data store, such as page image information and access rights information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

Various embodiments discussed or suggested herein can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device 712 (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method comprising:
under the control of one or more computer systems:
receiving a packet, the packet associated with a packet type and an attribute;
parsing the packet to determine the packet type and the attribute;
based on the packet type and the attribute,
determining a cache function for accessing a cache, wherein the cache function is an ambiguous function associated with the packet type, and
determining packet processing data associated with the packet type;
requesting, from the cache and using the cache function, a data context associated with the packet type;
determining that a cache miss has occurred in response to the request;
requesting the data context from a main memory;
storing the data context from the main memory in the cache using the cache function; and
processing the packet using the data context and the packet processing data, the cache processing packets of different packet types.

2. The method of claim 1, wherein the cache function is a cyclic redundancy check (CRC) function using a static seed associated with the packet type.

3. The method of claim 2, wherein an input to the CRC function is an address cache index based on a predetermined number of bits of an address of the data context in the main memory.

4. The method of claim 1, wherein the packet type includes one of a network packet, a storage packet, or a management packet.

5. A computer-implemented method comprising:
under the control of one or more computer systems:
determining a packet type for a packet, the packet type represented by a packet attribute value;
determining a cache access function using the attribute value, the cache access function mapping a main memory address to a cache index;
requesting data context information from a cache using the cache access function, the cache storing a plurality of data contexts, each data context associated with a different cache access function; and
processing the packet using the data context, the cache processing packets of different packet types.

6. The computer-implemented method of claim 5, wherein the cache access function is an ambiguous function.

7. The computer-implemented method of claim 6, wherein the cache access function is a cyclic redundancy check (CRC) function and wherein each packet type is associated with a different static seed value for the CRC function.

8. The computer-implemented method of claim 7, wherein an input to the CRC function is an address cache index based on a predetermined number of bits of an address of the data context information in the main memory.

9. The computer-implemented method of claim 5, wherein the packet type is a storage packet and wherein the data context is a queue ring stored in contiguous addresses in main memory.

10. The computer-implemented method of claim 9, further comprising:
storing the queue ring in the cache using the cache access function, wherein the queue ring is stored in non-consecutive indexes in the cache.

11. The computer-implemented method of claim 5, further comprising:
determining that a cache miss has occurred in response to the request for the data context information from the cache; and
requesting the data context information from a main memory.

12. The computer-implemented method of claim 5, wherein determining a cache access function using the attribute value comprises:
looking up the cache access function in a table, wherein the table is indexed using the attribute value, the table further including packet processing data associated with the packet type.

13. A computing device, comprising:
electronic circuitry, wherein the electronic circuitry is configured to:
determine a packet type for a packet;
determine a cache access function using the packet type, the cache access function mapping a main memory address to a cache index;
request data context information from a cache using the cache access function, the cache storing a plurality of data contexts, each data context associated with a different cache access function; and
process the packet using the data context, the cache processing packets of different packet types.

14. The computing device of claim 13, wherein the cache access function is an ambiguous function.

15. The computing device of claim 13, wherein the packet type is determined according to a packet attribute value of the packet.

16. The computing device of claim 13, wherein the electronic circuitry comprises a cache mapper circuit, and wherein the cache mapper circuit determines the cache access function using the packet type.

17. The computing device of claim 13, wherein the electronic circuitry comprises the cache.

18. The computing device of claim 13, wherein the electronic circuitry comprises a packet inspector circuit, and wherein the packet inspector circuit determines the packet type for the packet.

19. The computing device of claim 13, wherein the electronic circuitry comprises a function table.

20. The computing device of claim 13, wherein the computing device is a processor, a system-on-chip (SoC), a field-programmable gate array (FPGA), or an application-specific integrated circuit (ASIC).

* * * * *